(12) United States Patent
Kim et al.

(10) Patent No.: US 6,532,166 B1
(45) Date of Patent: Mar. 11, 2003

(54) MEMORY DEVICE USING A TRANSISTOR AND ITS FABRICATION METHOD

(75) Inventors: Yong Tae Kim, Seoul (KR); Young Kyun Park, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/623,501

(22) PCT Filed: Feb. 26, 1999

(86) PCT No.: PCT/KR99/00086

§ 371 (c)(1),
(2), (4) Date: Sep. 19, 2000

(87) PCT Pub. No.: WO00/08649

PCT Pub. Date: Feb. 17, 2000

(30) Foreign Application Priority Data

Aug. 6, 1998 (KR) .............................................. 98-32022

(51) Int. Cl.[7] ................................................ G11C 11/22

(52) U.S. Cl. .......................................... 365/145; 365/63

(58) Field of Search ............................ 365/145, 51, 63; 257/295, 256

(56) References Cited

U.S. PATENT DOCUMENTS

| 5,388,068 A | | 2/1995 | Ghoshal et al. |
| 5,587,944 A | | 12/1996 | Shen et al. |
| 5,671,181 A | | 9/1997 | Hatsuda |
| 5,796,650 A | * | 8/1998 | Wik et al. ..................... 365/150 |
| 6,018,171 A | * | 1/2000 | Hsu et al. ..................... 257/195 |
| 6,067,244 A | * | 5/2000 | Ma et al. ..................... 365/145 |
| 6,111,778 A | * | 8/2000 | Mcdonald et al. ........... 365/149 |
| 6,246,083 B1 | * | 6/2001 | Noble ......................... 257/296 |

* cited by examiner

Primary Examiner—Son T. Dinh
(74) Attorney, Agent, or Firm—Bacon & Thomas

(57) ABSTRACT

The present invention provides a memory device by using a single transistor, comprising a circuit including a gate of a memory cell and a P type well substrate for inputting (writing) information and another circuit including a source and a drain for outputting(reading) information. In other word, the memory device includes an information input/output circuit by using a pair of respective read and write terminals. The transistor comprises a source, a drain, and a ferroelectric element gate which are formed in a P type(or N type) well substrate. And the present invention provides a fabrication method for manufacturing the memory circuit, comprising depositing the P type (or N type) well structure on a Si wafer and forming the source, the drain and then the gate in the P type(or N type) well structure.

21 Claims, 4 Drawing Sheets

MEMORY DEVICE USING A TRANSISTOR AND ITS FABRICATION METHOD

TECHNICAL FIELD

The present invention relates generally to a memory device using a single transistor and its fabrication method, in which the transistor comprises a source(S), a drain(D), and a ferroelectric gate(G) which are formed in a P type(or N type) well substrate for reading/writing data. The P type(or N type) well substrate is formed by diffusing doping sources. More particularly, the present invention relates to a nonvolatile, non-destructive read-out memory device, which may read out a stored data without destroying the data, and its fabrication method.

BACKGROUND ART

The subject matter of the present application is disclosed in U.S. Pat. No. 5,559,733, filed Jun. 7, 1995 and U.S. Pat. No. 5,686,745, filed Jun. 19, 1995.

In general, a semiconductor memory is called a dynamic RAM(DRAM). The DRAM is a device capable of storing/choosing for reading the data by using a memory cell. Here, the memory cell comprises a transistor and a capacitor. Additionally, the DRAM performs a large capacity of memory function as integrating the memory cells. An integration rate of the memory cell now becomes higher and higher continuously according to technology of a very large scale integration(VLSI).

The DRAM always leads a most advanced microelectronic technology symbolized by device miniaturizing process, subminiature device and circuit design technology. The DRAM is a device of a mass product because a general manufacturing; process is stabilized and a circuit design is rarely changed. Advance of the device miniaturization shows an increment of the DRAM integration rate. Since 1 Kbyte DRAM showed in the 1970s, the capacity of the DRAM is increased almost 4 times of it at every 3 years and finally, the prototype of 1 Giga DRAM was realized in 1998. The high integration and large capacity of the DRAM are established by a bipolar transistor technology in the 1960s, in which the bipolar transistor may be operated with a high-speed even though it requires a large usage power. But an MOS technology is practically used because the manufacturing process is simple and requires low power dissipation since 1970s, and a CMOS technology having better low power dissipation, is now applied in the DRAM.

FIG. 1 is a circuitry diagram of a memory cell of a DRAM.

Referring to FIG. 1, the DRAM comprises a transistor as a switch, and a capacitor for storing data. A word line 1 is selected by an X-Address and a bit line 2 is selected by a Y-Address on a semiconductor memory which is fabricated by integrating the memory cells. Thereby, a cell data of the selected location is amplified and read externally. Binary "0" and "1" states, which are switched by applying a voltage pulse of sufficient magnitude. Here, binary information "1" or "0" is corresponded to whether the capacitor of the memory cell has a charge or not, in other words, a terminal voltage of the cell capacitor is higher or lower than a predetermined value.

When the voltage in accordance with the binary information is applied to the memory cell, "write" process is performed. And what the capacitor has the charge or not causes the voltage change to higher or lower, thereby "read" process is performed as a detecting it to an external memory cell. Data maintenance has ideally no power usage because the capacitor accumulates the charges.

But, there is a leak current in a PN junction of the MOS transistor, and the stored initial charge is therefore reduced. As a result, the data is lost. Accordingly, before losing the data, the capacitor should be recharged as much as the initial charge by matching the read information after reading the data of the memory cell. The memory maintains the data by which the above procedures should be repeated periodically. The recharging process is called refresh operation. The DRAM(Dynamic-RAM) is called because the data maintenance is dynamically accomplished through the repetition of the refresh operation.

In addition to the DRAM, there are a static RAM(SRAM), a ferroelectric RAM(FRAM), etc. The SRAM is used in a main memory of a supercomputer or a cache memory of a common calculator or a cache memory having a microprocessor, because of having durability of the information storage. And also it is commonly used for portable devices because the SRAM requires a low usage power for storing the data, even though there are disadvantages that manufacturing procedure is more complicated and it is more expensive than the DRAM to manufacture.

The FRAM is a new memory device which may successively store the data as using a memory cell, similar to DRAM, without supplying a power source. There are two kinds of FRAM; a destructive and a non-destructive type. The destructive FRAM comprises a transistor as a switch for reading/writing information and a capacitor of storing data. The destructive FRAM is similar to the DRAM except that the destructive FRAM uses a ferroelectric material as a capacitor. The ferroelectric material generates a spontaneous polarization without power source, it is therefore possible to have a continuous storage ability because of maintaining an electric characteristic successively. However, it should be required to reset that the information should be rewritten when the information stored in the capacitor is destroyed.

The non-destructive FRAM may perform a switching function with a single transistor as well as an information storage function, as an absolutely new memory device.

Accordingly, the non-destructive FRAM having a very simple structure, may improve an integration rate 10 times, comparing with the conventional DRAM or the destructive FRAM which have a single transistor and a single capacitor. The non-destructive FRAM including advantages of the DRAM and the destructive FRAM, may successively store information without power source, may use for a long time because of not requiring the reset function, and helps to establish a simple circuit.

DISCLOSURE OF INVENTION

However, it has not been invented the device structure, its fabrication method, and the subsidiary circuit of the non-destructive FRAM consisting of a single transistor for reading/writing information.

This invention is to resolve the problems described earlier and an object of the present invention is to provide the memory device structure, the fabrication method, and the subsidiary circuit of the non-destructive FRAM consisting of a single transistor for reading/writing information. The single transistor consists of a source, a drain, a ferroelectric gate, and a P type (or N type) well substrate. The ferroelectric gate and P type (or N type) well substrate are using for inputting(writing) information and a source and a drain are using for outputting(reading) information. Therefore, the memory, device has four terminals. In other words, the subsidiary circuit uses the four terminals for writing and reading information; two terminals (a gate and a substrate) for writing and two terminals (a source and a drain) for reading.

BEST MODE FOR CARRYING OUT THE INVENTION

Embodiments of the invention will be described with reference to the accompanying drawings.

Figure 1:
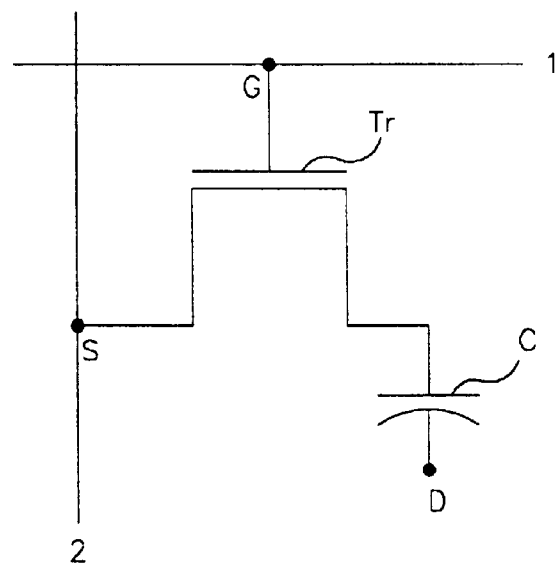
FIG. 1 is a circuitry diagram of a unit memory cell of a DRAM.
Figure 2:
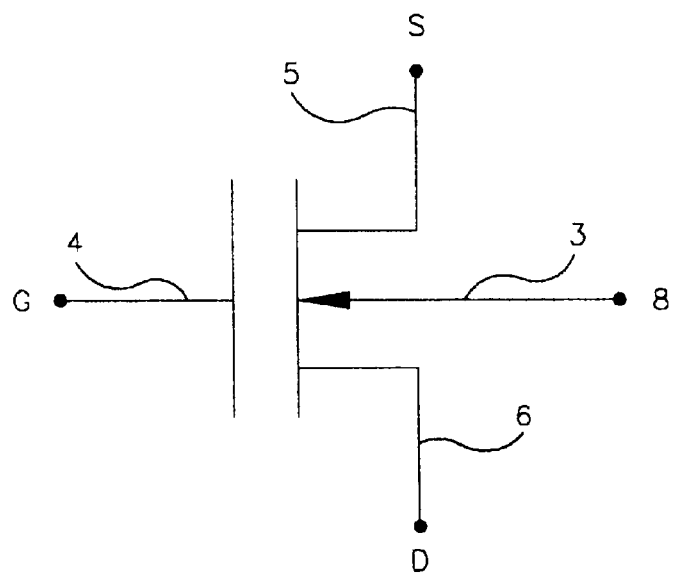
FIG. 2 is a circuitry diagram of a unit memory cell of a memory device consisting of a single transistor in accordance with the present invention.

FIG. 2 is a circuitry diagram of a unit memory cell of a memory device consisting of a single transistor in accordance with the present invention.

Figure 3:
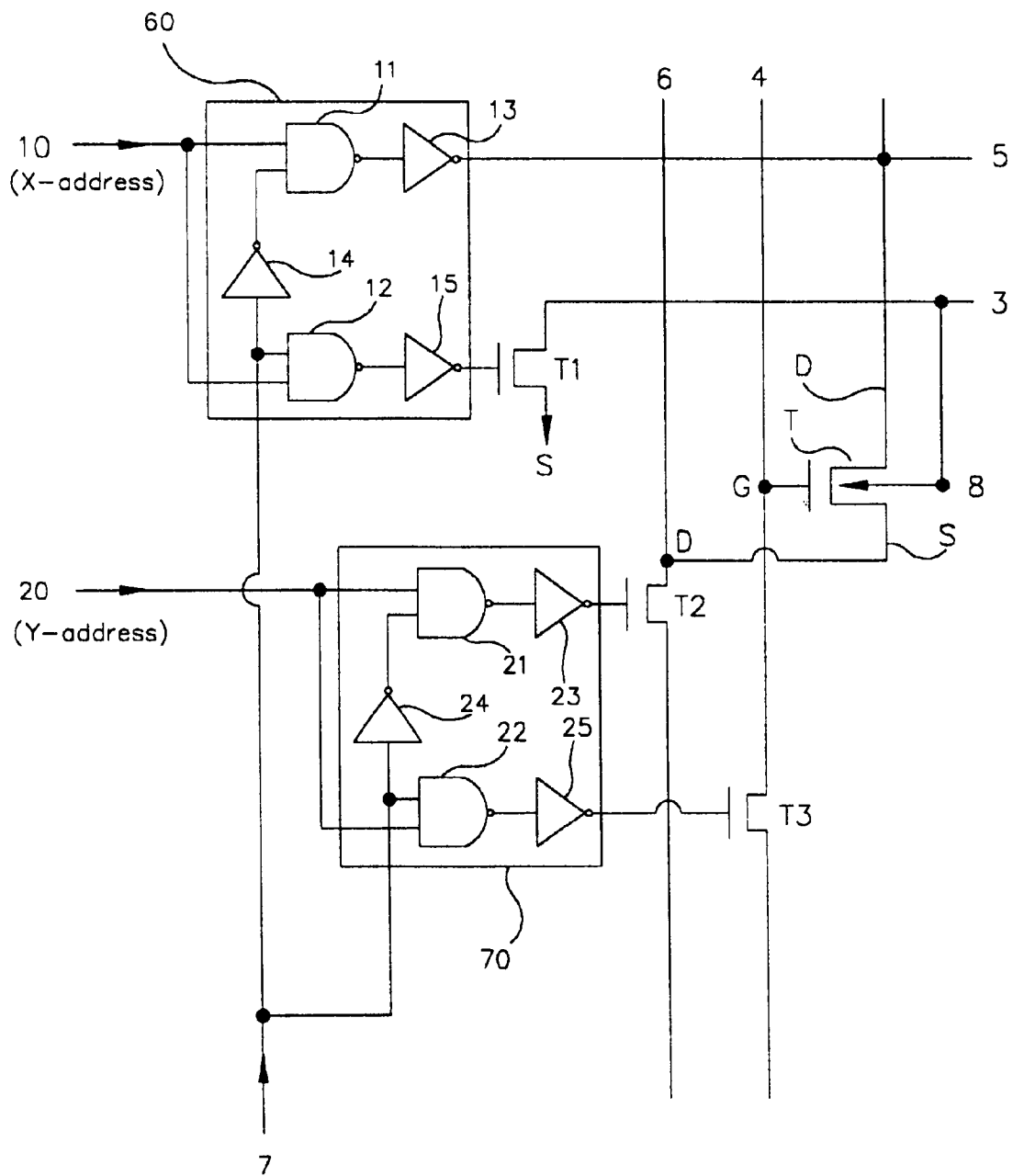
FIG. 3 is a circuitry diagram for inputting and outputting data to the unit memory cell of the FIG. 2.

FIG. 3 is a circuitry diagram for inputting and outputting data to the unit memory cell of the FIG. 2.

First, let's explain the circuitry diagram of the unit memory cell referring to FIG. 2. The unit memory cell has four terminals; a source, a drain, a ferroelectric gate, and a P type (or N type) well substrate. For writing data, a gate (G) terminal which is connected to a Write Bit Line (4) for writing and a P type (or N type) well substrate which is connected to a Write Word Line (8) for writing are used. And for reading the data, a source(S) terminal which is connected to a Read Word Line (5) for reading and a drain(D) terminal which is connected to a Read Bit Line (6) for reading are used. Therefore, terminals for writing data which consist of Write Bit Line (4) and Write Word Line (8) are electrically separated from terminals for reading data which consist of Read Write Line (5) and Read Bit Line (6).

Secondly, the input/output circuit for writing/reading the data on the unit memory cell of the memory device is explained. Here the memory device uses a single transistor as shown in FIG. 3.

The input/output circuit in FIG. 3 comprises a transistor (T) which stores and outputs the data. Logic Circuit 1 (60) which consists of two NAND gate(11 and 12) and three inverters (13, 14 and 15), and Logic Circuit 2(70) which consists of two NAND gates (21 and 22) and three inverters (23, 24 and 25). And the input/output circuit further comprises three transistors (T1, T2 and T3) for connecting the Logic Circuit 1 (60) and Logic Circuit 2 (70) to the transistor (T) in order to store/output the data to the transistor (T). And also the input/output circuit comprises a Write Bit Line (4) for writing and a Write Word Line (3) for writing which are data writing terminals, a Read Word Line (5) for reading and a Read Bit Line (6) which are data reading terminals.

Finally, the input/output circuit further comprises Word Line 1 (10) of inputting an X-address signal and Word Line 2 (20) of inputting Y-address signal.

Referring to FIG. 3, the operation principal of the invention are going to be described.

First, it is described how to input the data.

When a writing X-address signal through Word Line 1 (10) and a write enable signal (7) are inputted to the NAND gate (11 and 12) of the Logic Circuit 1 (60), the transistor 1 (T1) connected to Logic Circuit 1(60) turns "on". Because the P type (or N type) well substrate (8) of the transistor (T) is grounded through the grounded source (S) of the transistor 1 (T1), thereby the transistor (T) is selected among the unit devices. In order to input a data "1" to the transistor (T), voltage of +Vcc is applied to the gate (G) of the transistor (T) through the Write Bit Line (4) for writing.

During writing "1" to the transistor (T), the source (S) should be floating, whereas it does not matter which data is inputted to the drain (D). In other words, when the Y-address signal through Word Line 2 (20) and a write enable bar signal are inputted to the NAND gate (21 and 22) of Logic Circuit 2 (70) connected to the transistor 2 (T2), "0" signal is applied to the gate (G) of the transistor 2 (T2) connected to an output terminal of the Logic Circuit 2 (70). Therefore, the transistor 2 (T2) turns "off" and the source (S) of the transistor (T) is therefore floating. Here the "floating" state means that no voltage is applied and no ground is connected to the terminal. In addition, because an X-address signal and a write enable bar signal are inputted to the drain (D) of the transistor (T), it is grounded by "0" signal. Accordingly, the transistor (T), which is selected among the unit devices by the P type (or N type) well substrate, can be input the data "0" or "1". The gate (G) of the transistor (T) is comprised of metal, ferroelectric material, insulator and silicon.

Now it is described how to store (write) the data by applied voltage to the gate (G) of the transistor (T).

In contrast to the capacitor of DRAM in which stores information by a stored charge, the present invention uses a bistable nonvolatile polarization state based on a ferroelectric effect. Ferroelectric materials, such as $SrBi_2Ta_2O_{9(SBT)}$, $PbZrTiO_{3(PZT)}$, $PbLnSrTiO_{3(PLZT)}$, $BaSrTiO_{3(BST)}$, and $SrBi_2TNb_2O_{9(SBTN)}$ polarize spontaneously under the influence of an external field and to remain polarized even after the external field is removed. In other words, when voltage +Vcc is applied to the gate (G), the ferroelectric material polarizes downward and stores the data of "1". Then, the information of data of "1" remains even after the voltage +Vcc applied to the gate (G) is removed. Meanwhile, the polarization can be reversed by applying a field of opposite polarity. In other words, when voltage −Vcc is applied to the gate (G), the ferroelectric material polarizes upward and stores the data of "0". Then, the information of data of "0" remains even after the voltage −Vcc applied to the gate (G) is removed. Here, for the convenience, we name the applied voltage of +Vcc or −Vcc to write the data the "write voltage". On the other hand, when the voltage is used for reading the data, we name it "read voltage".

The data "0" or "1" can be stored in the particular transistor(T) by designating an address assigned by a row and a column of the unit device by the signal inputted through the circuit of the Write Word Line (3) for writing and the Write Bit Line (4) for writing.

Next it is described how to output (read) the data.

The data can be read by sensing the interaction of a read field with the polarization state of the ferroelectric material. If a "read voltage" is applied to the ferroelectric material of polarity opposite to the previous "write voltage", the polarization state will switch, giving rise to a large displacement charge that can be sensed by proper circuitry. In other words, in order to read the stored data in the transistor (T), a writing X-address signal through Word Line 1(10) and a write enable bar signal through Word Line(5) for reading are inputted to the NAND gates (11 and 12) of the Logic Circuit 1(60), then the voltage +Vcc is applied to the drain (D) of the transistor (T). In addition, the Y-address signal and a write enable bar signal through Word Line 7 are inputted to the NAND gates (21 and 22) of the Logic Circuit 2(70) and the voltage −Vcc is applied to a gate of transistor 2 (T2). Thereby, the transistor 2 (T2) turns "on" and selection is finally completed to read the data stored in the transistor (T).

After completion the selection, the data is transmitted to a supervising circuit through the Read Bit Line (6) for reading thereby the data reading is completed. As explained above, when the gate (G) of the transistor (T) outputs "0" data by the Logic Circuit 2 (70), transistor 3 (T3) turns "off" and then the gate (G) of the transistor (T) is floating. When "0" data is outputted from Logic Circuit 1(60), the P type (or N type) well substrate (8) is grounded. In the above process, "0" or "1" data inputted to the gate (G) can be successively read. When the source (S) of the transistor (T) reads the data, it is determined to "1" in case that measured current is more than predetermined current and to "0" in the other case. Because of comprising a pair of word line and a pair of bit line, one unit device can read the data during the other unit device writes the data. As a result, there is an improved processing speed.

Figure 4:
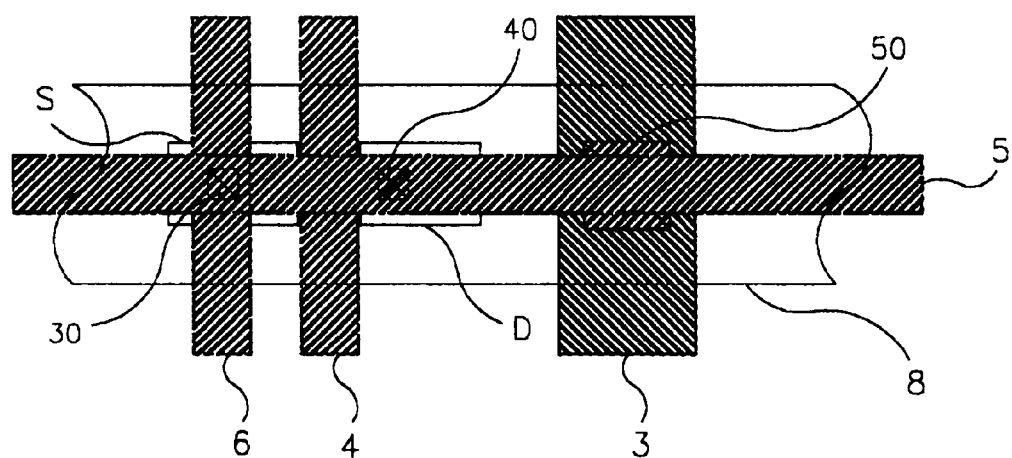
FIG. 4 shows a mask pattern for fabricating the unit memory cell of the memory device comprised a single transistor.
Figure 5:
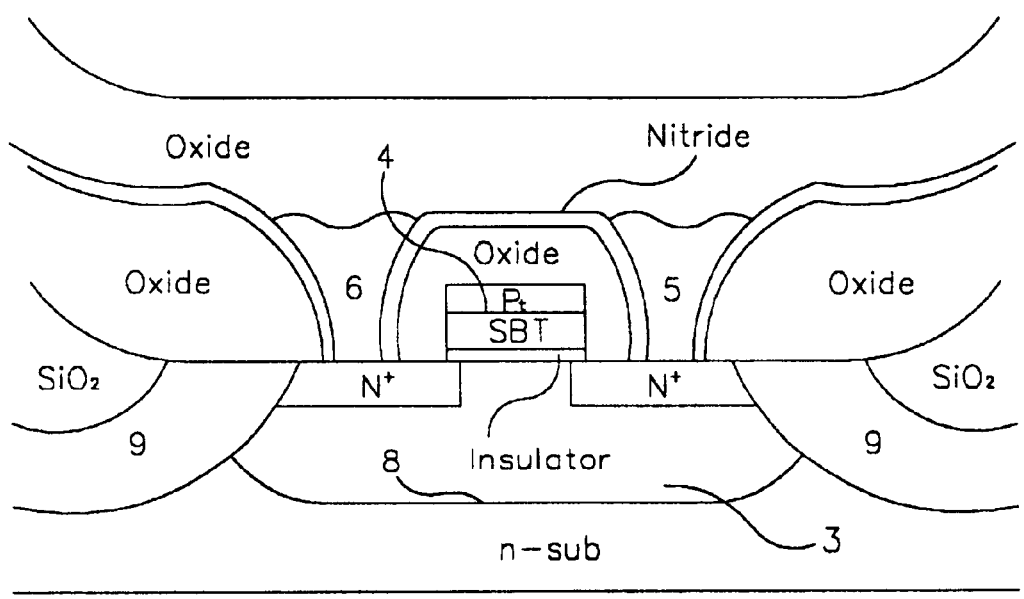
FIG. 5 is a schematic cross sectional view showing the unit memory cell of the memory device comprised a single transistor.
Figure 6:
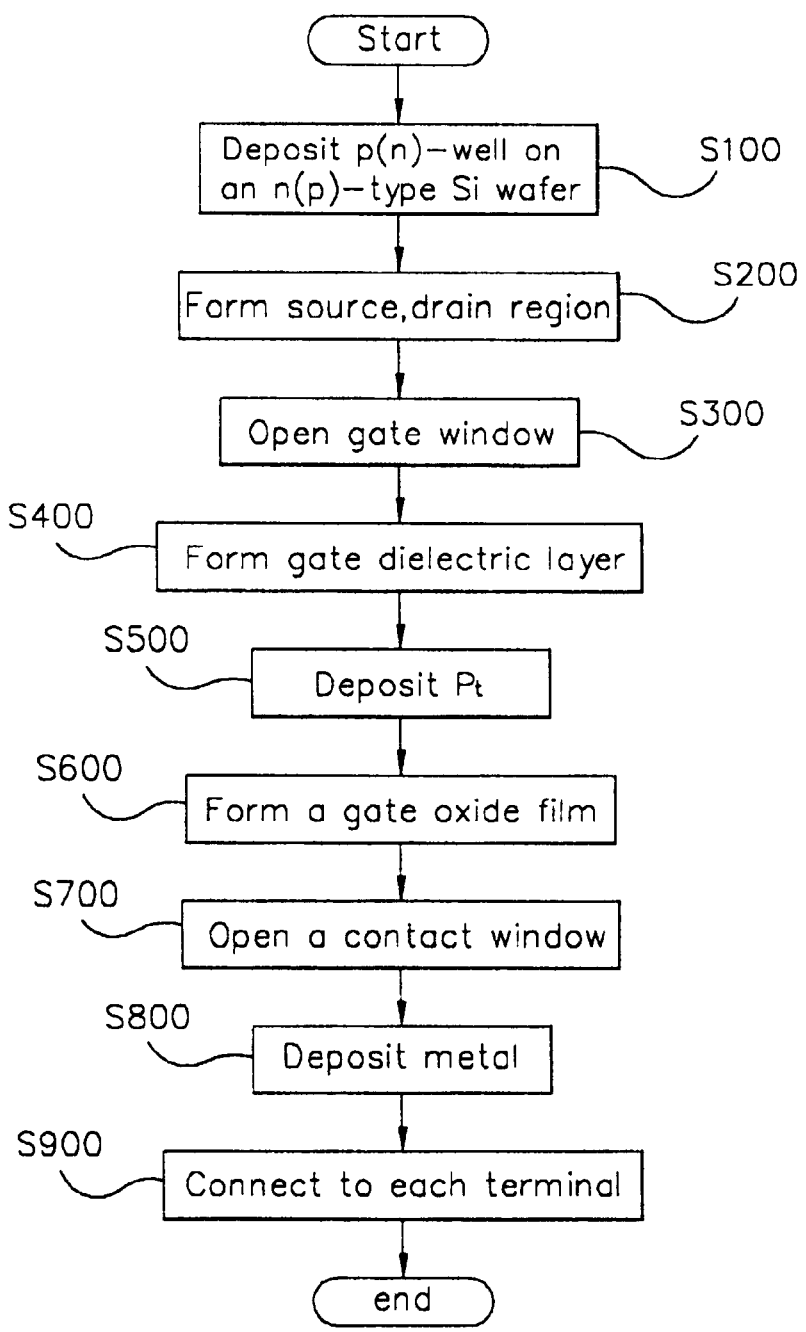
FIG. 6 is a flowchart explaining a fabrication procedure of the unit memory cell of the memory device comprised the single transistor.

Referring to FIGS. 4, 5 and 6, the fabrication method of a basic unit memory cell of the memory device comprised a single transistor is described.

FIG. 4 shows a mask pattern for fabricating the unit memory cell of the memory device comprised a single transistor.

FIG. 5 is a schematic cross sectional view showing the unit memory cell of the memory device comprised a single transistor.

FIG. 6 is a flowchart explaining a fabrication procedure of the unit memory cell of the memory device comprised the single transistor.

Referring to FIGS. 4, 5 and 6, the first step of the fabrication is forming a P type (or N type) well (8) in the N type (or P type) silicon water (S100).

Then, a source (S) and a drain (D) region are formed in the P type (or N type) well substrate (S200).

In order to form a gate between the source (S) and the drain (D), a gate window is opened (S300).

After opening the gate window as described in S300, a gate dielectric layer is formed in the gate region formed in S300 (S400).

And the method further comprises the steps of sputtering (or other methods) of Platinum (Pt) as a gate electrode on the gate dielectric layer (S500).

Then, a gate oxide film is formed above the gate dielectric layer (S600).

Next step is to open contact windows (30, 40 and 50 in FIG. 4) for the source (S), the drain (D), and the P type well substrate (S700).

After opening the contact windows as described in S700, metallization on each contact windows (30, 40 and 50 in FIG. 4) for the source (S), the drain (D), and the P, type well substrate is done (S800).

When the metallization as described in S800 is done, source (S) is connected to the Read Bit Line (6) (dashed line in FIG. 4), and the drain (D) is connected to the Read Word Line (5) (double-chain-dashed line in FIG. 4), and the P type (or N type) well substrate is connected to the Write Word Line (3) (solid line in FIG. 4), and the gate (G) is connected to the Write Bit Line (4) (chain-dashed line in FIG. 4) (S900).

Referring to FIG. 5, a schematic cross sectional view showing the unit memory cell of the memory device comprised a single transistor will be explained.

At first, an N type (or P type) silicon wafer having (100) direction is used. The resistivity of the silicon wafer is in the range of 2–10 Ω-cm. First form the P type(or N type) well having a 4–5 μm in depth. Then, form the source(S) and the drain(D) in the P type (or N type) well substrate. Next, after removing the oxide film of the gate(G) region, deposit a thin insulating layer, such as $CeO_2$, $Y_2O_3$, $YMNO_3$, $SiO_2$, SiON, etc. Then, deposit a ferroelectric thin film, such as $SrBi_2Ta_2O_{9(SBT)}$, $PbZrTiO_{3(PZT)}$, $PbLnZrTiO_{3(PLZT)}$, $BaSrTiO_{3(BST)}$, $SrBi_2TNb_2O_{9(SBTN)}$, etc., on the thin insulator. Then, form a gate electrode using Platinum (Pt). The metallization can be done by sputtering or other methods. The electrode can be formed by Pt, Al, W, Pt/W-B-N, PT/W-N, Al/Pt, Al/Pt/W-N, Al/Pt/W-B-N, etc. After metallization, a passivation layer is formed using Oxide and Nitride. Then, the contact windows (30, 40 and 50) in FIG. 4 for the source (S), the drain (D), and the P type well substrate is opened. After opening the contact windows, the interconnecting metallization is formed using metal, such as Al, W, Al/W, TiN/Al, etc. It is noted that the interconnecting metallization should be long enough to connect among the unit devices shown in FIG. 3. After the interconnecting metallization, the BPSG is deposited, and then planarization is done in order to planarize the device surface.

The P type(or N type) well substrate (8) itself may be the Write Word Line (3) as well as isolates each unit device electrically. In order to isolate each unit devices electrically, instead of the P type (or N type) well substrate as described before, a buried oxide on an N type of (or P type) silicon wafer or SOI (silicon on insulator) can be used. In addition, in order to isolate the P type (or N type) well substrate (8), insulating trenches are made by forming oxide layer in both sides of the P type (or N type) well substrate referring to FIG. 4. If the SOI structure is used, fabrication processes may be simpler and easier than using the P type (or N type) well because of no side diffusion process, and may accomplish large integration. When the unit memory cells are arranged in memory matrix array vertically and horizontally, it becomes a VLST memory device, and can be used as a general memory system.

Consequently, the memory device comprising a single transistor and its fabrication method are established as intended in the present invention through the processes described above.

From the explanation up to here, the present invention provides a memory device using a single transistor, comprising a source, a drain, a ferroelectric gate formed in a P type (or N type) well substrate region. The memory device has a circuit for inputting (writing) information using a pair of writing leads which are a gate of a memory cell and a P type (or N type) well substrate and a circuit for outputting (reading) information using a pair of reading leads which are a source and a drain. And the present invention provides a fabrication method for manufacturing the memory circuit, comprising forming the P type (or N type) well on a silicon wafer and forming the source, the drain and then the gate on the P type (or N type) well. Since it is possible to read and write data at the same time by separating circuits for writing and reading, a very large scale integration is feasible.

The present invention is not limited to the specifically disclosed embodiments, and variations and modifications may be made without departing from the scope of the present invention.

INDUSTRIAL APPLICABILITY

With the foregoing memory device using a transistor and its fabrication in accordance with the present invention, the FRAM may have an information processing speed as fast as DRAM, as well as read/write information successively, like SRAM. Additionally, the present invention accomplishes a very large scale integration having the above advantages.

What is claimed is:

1. A memory device for reading/writing data signal by using a single transistor, wherein information input/output circuit comprises:

the first terminal, a P type (or N type) well substrate connected to a Write Word Line(3);

the fourth terminal, a ferroelectric gate connected a Write Bit Line(4), the second terminal, a drain connected a Read Word Line(5); and the third terminal, a source connected to a Read bit Line(6).

2. A memory device as claimed in claim 1, comprising an array of a very large scale integration device by serially arraying information input/output circuit vertically and horizontally, in which the information input/output circuit comprises:

the first terminal connected to a Write Word Line(3);

the fourth terminal connected a Write Bit Line(4);

the second terminal connected a Read Word Line(5); and the third terminal connected to a Read Bit Line(6).

3. A memory device as claimed in claim 2, wherein a data signal is inputted in the input/output circuit by designation an address through the first terminal and successively stores the data signal which is inputted through a word line of the gate(G) of the designated address.

4. A memory device as claimed in claim 2, wherein a data signal output unit of the information input/output circuit designates address for reading the data through the drain(D) of the transistor(T) and reads the data through the source(S) of the transistor(T).

5. A memory device as claimed in claim 1, wherein the information input/output circuit connected to the transistor (T), comprises:

a Logic Circuit 1 of comprising two NAND gates, in which a Word Line 1 signal(10) and a write enable signal(7) are inputted into the NAND gates, and three inverters;

a transistor(T1) which is connected to between output terminal of the Logic Circuit 1 and the Write Word Line(3) for writing;

a transistor(T2) which is connected to between output terminal of the Logic Circuit 2 and the Read Bit Line(6) for reading; and a transistor(T3) which is connected to between another output terminal of the Logic Circuit 2 and the Write Bit Line(4) for writing, is connected to the transistor(T).

6. A memory device as claimed in claim 5, wherein when the Word Line 1 signal(10) and the write enable signal(7) are inputted to the NAND gate of the Logic Circuit 1, the data signal passed inverter is inputted to the gate(G) of the transistor(T1), and the outputted to the Write Word Line(3).

7. A memory device as claimed in claim 5, wherein when the Word Line 2 signal(20) and the write enable bar signal are inputted to the NAND of the Logic Circuit 2, the data signal passed inverter is inputted to the gate(G) of the Transistor 2(T2), and then outputted to the Read Bit Line(6).

8. A memory device as claimed in claim 5, wherein when the Word Line 1 signal(10) and a write enable bar signal inverted by the inverter of the Logic Circuit 1 are inputted to the NAND gate, the data signal passed the NAND gate passes inverter and then is outputted to the Read Bit Line(6), then it is applied to the drain(D) of the transistor(T).

9. A memory device as claimed in claim 5, wherein when the Word Line 2 signal(2) and the write enable signal(7) are inputted to the NAND gate of the Logic Circuit 2, the data signal passed the NAND gate passes inverter and then is inputted to the gate(G) of the transistor (T3), then it is outputted to the Write Bit Line(4).

10. A memory device is claimed in claim 5, wherein when the Word Line(3), Write Bit Line(4), Read Word Line(5) and Read Bit Line(6) are arranged vertically and horizontally.

11. A memory system comprising a memory device as a memory cell capable of writing/reading data by using a single transistor, wherein the transistor comprises:

the first terminal, a P type (or N type) well substrate connected to a Write Word Line(3);

the fourth terminal a ferroelectric gate connected to a Write Bit Line(4), the second terminal, a drain connected to a Read Word Line(5); and the third terminal, a source connected to a Read Bit Line(6).

12. A memory system as claimed in claim 11, comprising an array of very large scale integration device by serially arraying information input/output circuit vertically and horizontally, in which the information input/output circuit comprising:

the first terminal connected to a Write Word Line(3);

the fourth terminal connected to Write Bit Line(4);

the second terminal connected a Read Word Line(5); and the third terminal connected to a Read Bit Line(6).

13. A memory system as claimed in claim 11, wherein an output signal of the input/output circuit and be outputted by designating an address for reading through the drain(D) of the transistor(T), and reading the data through the source(S) of the transistor(T).

14. A memory system as claimed in claim 11, wherein an input signal of the input/output circuit can be inputted by designating an address for writing through the first terminal, and the inputted data through the Word Line of the gate(G) remains after the writing signal is removed.

15. A memory system as claimed in claim 11, wherein an information input/output circuit which is connected to the transport(T), comprising:

a Logic Circuit 1 of comprising two NAND gates, in which a Word Line 1 Signal(10) and a write enable signal(7) are inputted into the NAND gates, and three inverters;

a Logic Circuit 2 of comprising two NAND gates, in which a Word Line 2 Signal(20) and a write enable abar signal are inputted into the NAND gates, and three inverters;

a transistor(T1) which is connected to between output terminal of the Logic Circuit 1 and the Write Word Line(3);

a transistor(T2) which is connected to between output terminal of the Logic Circuit 2 and the Write Word Line(6);

a transistor(T3) which is connected to between another output terminal of the Logic Circuit 2 and the Write Word Line(4).

16. A memory system as claimed in claim 12, wherein when the Word Line 1 signal(10) and the write enable signal(7) are inputted to the NAND of the Logic Circuit 1, the data signal passed inverter is inputted to the gate(G) of the first transistor(T1), and then outputted to the Write Word Line(3).

17. A memory system as claimed in claim 12, wherein when the Word Line 2 signal(20) and the write enable bar signal are inputted to the NAND of the Logic Circuit 2, the data signal passed inverter is inputted to the gate(G) of the second transistor(T2), and then outputted to the Read Bit Line(4).

18. A memory system as claimed in claim 12, wherein when the Word Line 1signal(10) and a write enable signal(7) inverted by the inverter of the Logic Circuit 1 are inputted to the NAND gate, the data signal passed the NAND gate passes inverter and is outputted to the Read Bit Line(5), then it is applied to the drain(D) of the transistor(T).

19. A memory system as claimed in claim 12, wherein when the Word Line 2 signal(20) and the write enable signal(7) are inputted to the NAND gate of the Logic Circuit 2, the data signal passed the NAND gate passes inverter and then is inputted to the gate(G) of the transistor(T3), then it is outputted to the Write Bit Line(4).

20. A memory system as claimed in claim 12, wherein the Write Word Line(3), Write Bit Line(4), Read Word Line(5), and Read Bit Line(6) are arranged vertically and horizontally.

21. A memory system as claimed in claim 17, wherein a very large scale integration device serially arrays information input/output circuit vertically and horizontally.

* * * * *